United States Patent
Soerensen (10) Patent No.: US 7,633,806 B2
(45) Date of Patent: Dec. 15, 2009

(54) MEMORY DEVICE WITH A NONVOLATILE MEMORY ARRAY

(75) Inventor: Arno Soerensen, Munich (DE)

(73) Assignee: Atmel Automotive GmbH, Heilbronn (DE)

( * ) Notice: Subject to any disclaimer, the term of this patent is extended or adjusted under 35 U.S.C. 154(b) by 44 days.

(21) Appl. No.: 11/802,236

(22) Filed: May 21, 2007

(65) Prior Publication Data

US 2007/0297239 A1 Dec. 27, 2007

Related U.S. Application Data

(60) Provisional application No. 60/801,404, filed on May 19, 2006.

(30) Foreign Application Priority Data

May 19, 2006 (DE) .................. 10 2006 023 934

(51) Int. Cl.
*G11C 16/06* (2006.01)
(52) U.S. Cl. .............. 365/185.23; 365/189.16; 365/189.09; 365/189.11; 365/230.06; 365/233.19
(58) Field of Classification Search ............ 365/185.23, 365/189.16, 189.09, 189.11, 230.06, 233.19
See application file for complete search history.

(56) References Cited

U.S. PATENT DOCUMENTS

| 4,698,787 A | 10/1987 | Mukherjee et al. |
| 5,412,603 A | 5/1995 | Schreck et al. |
| 6,420,933 B1* | 7/2002 | Gibson et al. ............... 330/263 |
| 7,023,738 B2 | 4/2006 | Vimercati et al. |
| 2004/0062085 A1 | 4/2004 | Wang et al. |
| 2005/0057970 A1* | 3/2005 | Ogura et al. ........... 365/185.23 |
| 2006/0028248 A1* | 2/2006 | Gruber et al. .................. 327/77 |
| 2006/0050572 A1* | 3/2006 | Gouin et al. ................. 365/194 |

FOREIGN PATENT DOCUMENTS

| DE | 695 22 738 | 7/2002 |
| EP | 0426417 | 5/1991 |
| WO | WO-2006075202 | 7/2006 |

* cited by examiner

*Primary Examiner*—Hoai V Ho
*Assistant Examiner*—Fernando N Hidalgo
(74) *Attorney, Agent, or Firm*—Muncy, Geissler, Olds & Lowe, PLLC (57) ABSTRACT

A memory device having a nonvolatile memory array, at least one driver for programming the memory array, which driver is connected to the memory array in order to drive a programming potential, and a drive circuit for controlling the at least one driver, wherein the drive circuit has at least one switch for switching a current as a function of the digital logic potential at the input and the drive circuit has a current-to-voltage converter connected to the output, which converter is designed to output a control potential depending on the switched current for driving the at least one driver.

14 Claims, 4 Drawing Sheets

MEMORY DEVICE WITH A NONVOLATILE MEMORY ARRAY

This nonprovisional application claims priority to German Patent Application No. de 102006023934, which was filed in Germany on May 19, 2006, and to U.S. Provisional Application No. 60/801,404, which was filed on May 19, 2006, and which are both herein incorporated by reference.

BACKGROUND OF THE INVENTION

1. Field of the Invention

The present invention relates to a memory device with a nonvolatile memory array, in particular an electrically erasable programmable read only memory (EEPROM) array field or an electrically programmable read only memory (EPROM) array field.

2. Description of the Background Art

Electrically erasable programmable read only memories are known by the abbreviation EEPROM or $E^2$PROM. EEPROMs that use programming by injection of hot charge carriers in place of programming by tunneling based on Fowler-Nordheim are known from U.S. Pat. No. 4,698,787 or DE 695 22 738 T2, which corresponds to U.S. Pat. No. 5,412,603, for example.

From U.S. Pat. No. 7,023,738, a circuit for driving a column/row of nonvolatile memory is known. Potential shifters are used for shifting a logic value of a corresponding selection signal to a bias voltage, and a selector is used for applying a first operative signal or a second bias voltage to a memory line according to the second operative signal.

Figures 1, 2:
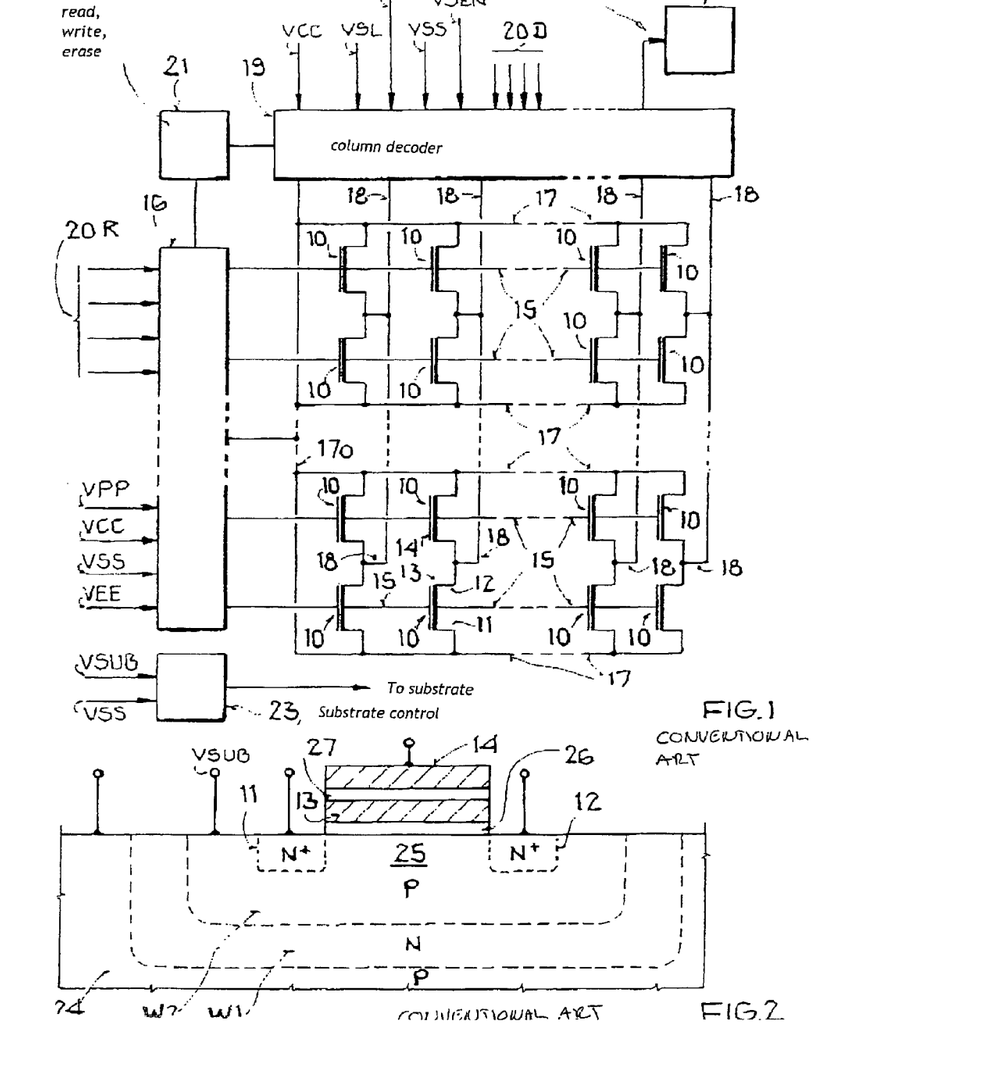

In a method for programming memory cells as shown in FIGS. 1 and 2 using hot channel techniques for programming a cell by injection of hot charge carriers, a high voltage is applied to the control gate. During programming of a selected cell by the injection of hot charge carriers, the voltages applied to the source, drain and control gate are as follows: a reference voltage applied to the source, which is equal to the substrate voltage (VSS, which may be 0 volts); a first positive voltage VBL of approximately +5 to +7 V with respect to the reference voltage, applied to the drain; and a second positive voltage VPP with respect to the reference voltage, applied to the control gate.

Under these conditions, the channel between the drain and the source is highly conductive. Electrons that reach the substrate/drain PN junction are subjected to two electric fields in the array (EEPROM), one of which is associated with the substrate/drain PN junction, which is biased in the reverse direction, and the other of which is associated with the positive voltage between the control gate and the floating gate.

The electric field in the array produced in the silicon substrate in the vicinity of the substrate/drain PN junction and the interface to the floating gate is the primary factor in determining programmability by injection of hot charge carriers in memories with floating gates such as EPROM and flash EPROM array fields. The electric field in the array depends primarily on the drain-to-source potential, but also includes other parameters such as the doping profiles of the channel zone and the drain zone.

One type of memory array field with floating gate requires both a 5 volt power supply and a 12 volt power supply as supply potentials. In such dual-supply memories, the 12 volt voltage is used to supply the +5 V to +7 V drain voltage VBL that is necessary during programming. Another type of memory array field with floating gate requires a single 5 V supply. In this single-supply memory, the 5 volt power supply is pumped through a charge pump circuit in order to supply a drain voltage VBL that is greater than +6 V during programming.

According to DE 695 22 738 T2, a charge pump circuit can be used which pumps the source of a selected cell to a voltage that is smaller than the voltage at the reference terminal of the integrated memory circuit. At the same time, the drain potential of the selected cell is pumped to a voltage that is greater than the voltage at the supply voltage terminal of the memory.

For example, in DE 695 22 738 T2, a drain-to-source voltage of approximately 6 V is achieved from a 3 V supply by using a charge pump circuit which pumps the source voltage to approximately 1.5 V below the voltage at the reference terminal of this 3 V supply and simultaneously pumps the drain voltage to 1.5 V above the voltage at the positive terminal of this 3 V supply. The charge pump circuit can also be used to pump the cell substrate voltage to a value that is close to or smaller than the source voltage. To increase the effectiveness of the programming, the cell substrate voltage is pumped to a value smaller than the source voltage.

Shown in FIG. 1 in order to illustrate the prior art is an array field (EEPROM) of memory cells which are integrated in a memory component. Each cell is a transistor 10 with a source 11, a drain 12, a floating gate 13 and a control gate 14. Each control gate 14 of a row of cells 10 is connected to a word line 15, while each word line 15 is connected to a word line decoder 16.

Each source 11 in a row of cells 10 is connected to a source line 17. Each drain 12 in a row of cells 10 is connected to a drain column line 18. Each source line 17 is connected to a column decoder 19 through a line 17a common to the columns, and each drain column line 18 is connected to the column decoder 19.

In read mode, the word line decoder 16 is used to apply—in response to word line address signals through the lines 20R and signals from the read/write/erase control circuit 21, which can be a microprocessor, for example—a predefined positive potential VCC (approximately +5 V) to the selected word line 15 and to apply a low potential (ground or VSS) to the deselected word lines 15.

The column decoder 19 is used to apply a predefined positive potential VSEN (approximately +1 V) to at least the selected drain column line 18 and to apply a low potential (0 V) to the source line 17. The column decoder 19 is also used to connect the selected drain column line 18 of the chosen cell 10 to the data input/data output terminal 22 in response to signals over the address lines 20D. The conductive or non-conductive state of the cell 10 connected to the selected drain column line 18 and to the selected word line 15 is detected by a read amplifier (not shown in FIG. 1) that is connected to the data input/data output terminal 22.

In flash erase mode, the column decoder 19 can be used to drive all drain column lines 18 into a floating state (to connect to a high impedance, such as array field effect transistors that are biased in an OFF state). The word line decoder 16 serves, for example, to connect all word lines 15 to a negative potential VEE (for instance, −10 V or −13 V). The column decoder 19 is additionally used to apply a positive potential VCC (for instance, +5 V or +3 V) to all source lines 17.

The substrate insulation well W2 from FIG. 2 of DE 695 22 738 T2 is connected to VSS or 0 V by a substrate control circuit 23. The word line decoder 16 is used to connect all word lines 15 to a negative potential VEE (approximately −9 V).

The column decoder 19 is also used to connect all source lines 17 and all drain lines 18 to +6 V. The substrate insulation well W2 is likewise connected to +6 V here. These erase voltages between the potentials produce sufficient field strength across the gate oxide zone to generate a Fowler-Nordheim tunneling current that transfers charge from the floating gate 13, causing the memory cell 10 to be erased. Since the potential on the word line 15 is negative, the cell 10 remains in the nonconductive state during the erasure.

In the write, or program, mode from DE 695 22 738 T2, the word line decoder 16 may serve, in response to word line address signals on the lines 20R and to signals from the read/write/erase control circuit 21, to place a predefined first programming potential VPP (approximately +12 V) on a selected word line 15, including a selected control gate 14. The column decoder 19 also serves to place a second programming potential VBL (approximately +5 V to +10 V) on a selected drain column line 18 and, therefore, the drain 12 of the selected cell 10.

In the circuit from FIGS. 1 and 2 of this prior art technology, the source lines 17 are connected to, for example, the reference potential VSS, which may be ground. All of the deselected drain column lines 18 are connected to the reference potential VSS or are floated. On account of these potential differences, the programming voltages create a high current (drain 12 to source 11) condition in the channel of the selected memory cell 10, resulting in the generation near the drain/channel junction of hot channel electrons and avalanche-breakdown electrons that are injected across the channel oxide to the floating gate 13 of the selected cell 10.

The programming time is selected to be sufficiently long to program the floating gate 13 with a negative programming charge of approximately −2 V to −6 V with respect to the channel region (with the control gate 14 at 0 V). For this reason, the prior art programming potential VPP of 12 V, for example, on a selected word line 15, including the selected control gate 14, places a potential of approximately +7.2 V on the selected floating gate 13.

The voltage between the floating gate 13 (at approximately +7.2 V) and the grounded (approximately 0 V) source line 17 is insufficient to cause a Fowler-Nordheim tunneling current across the gate oxide between a source 11 and a floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with +5 V on its control gate 14, a state which is read as a "zero" bit. Unprogrammed cells 10 have source-drain paths under the floating gate 13 that are conductive with +5 V on their control gates 14, and those cells 10 are read as "one" bits.

In the write, or program, operation according to the prior art shown in FIGS. 1 and 2, the drain-to-source potential required for programming is achieved by using a charge pump circuit to pump the source 11 of the selected cell 10 to a potential VSL about −1 V to −2 V below the potential VSS at the negative terminal of the supply (perhaps 3 V) while, at the same time, pumping the drain 12 of the selected cell 10 to a potential VBL of approximately +6 V above the potential at the source.

At the same time, a substrate potential VSUB of a substrate isolation well W2 in the substrate 24 is connected by a substrate control circuit 23 to either the potential VSUB, which may be the same potential VSL as the source 11, or to a more negative value of about −2 V to −3 V below the potential VSS at the negative terminal of the power supply. The substrate isolation well W2 must isolate at least each selected cell 10 or the entire memory cell array field.

Programming of the selected cell 10 by hot charge carrier injection is achieved by applying a pulse from VPP of about +10 V on the gate 14 of the selected cell 10. The deselected word lines are connected to VSS or 0 V, or to a potential about −1 V to −2 V with respect to VSS to prevent leakage losses through deselected cells.

SUMMARY OF THE INVENTION

It is therefore an object of the present invention to provide a memory device that is as simple as possible to manufacture.

Accordingly, a memory device is provided with a nonvolatile memory array. This nonvolatile memory array is preferably an electrically erasable programmable read only memory (EEPROM) array or an electrically programmable read only memory (EPROM) array. In this context, the nonvolatile memory array does not lose the stored data when the supply voltage is disconnected.

The memory device preferably has at least one driver for programming the memory array. The driver is used to drive a programming potential, and to this end it is connected to the memory array. In this regard, the driver is designed for the currents and voltages required for programming, so that, for example, transistors with sufficient voltage-carrying and/or current-carrying capacity for the programming potential are used for the driver. Depending on the memory cell structure used, the programming may require a positive programming potential or a negative programming potential. In advantageous fashion, the memory device uses both a positive and a negative programming potential in order to apply their voltage difference for programming the cell of the nonvolatile memory array.

In order to control the at least one driver, a drive circuit is provided. The drive circuit preferably controls the driver as a function of a bit value, which is to say a logic zero or a logic one, at the input. The bit value here is advantageously one of two digital logic potentials, for example +5 volts or ground. The drive circuit here is designed to convert this binary information at its input into a control potential.

To this end, the drive circuit can have at least one switch for switching a current as a function of the digital logic potential at the input. The switched current flow here contains the information on the bit value at the input. For example, it is possible to associate current flow with the value logic one, and to associate the value logic zero with "no current flow." Preferably, provision is made for the value of logic one to be associated with a first current flow, and logic zero to be associated with a second current flow. In this case, a switch for the first current flow and a switch for the second current flow must be provided, and these are advantageously connected to one another through an inverter. A switching transistor, advantageously an NMOS field effect transistor or a PMOS field effect transistor, may be used as switches, for example.

The drive circuit preferably has a current-to-voltage converter connected to an output. This current-to-voltage converter is designed to output a control potential depending on the switched current for driving the at least one driver. The current-to-voltage converter converts the binary information contained in the switched current into the control potential, wherein the control potential for driving the at least one driver is preferably switched between two potential values as a function of the binary information. The control potential here is preferably switched between potential values that are both higher than the positive logic potential or are both lower than the logic potential ground.

According to an embodiment, the current-to-voltage converter has a current-summing node, wherein the control potential depends on the potential at the current-summing node. The sum of the currents out of and into the current-summing node is zero. In an advantageous embodiment of the invention, the current-to-voltage converter has a threshold switch whose input is connected to the current-summing node and whose output is connected to the output of the drive circuit. One such threshold switch is, for example, a Schmitt trigger, which provides a defined digital output signal.

Provision is made in an embodiment of the invention that the current-to-voltage converter has a number of current mirrors for mirroring the switched current into the current-summing node. In this context, the switched current advantageously flows at least through one current mirror that mirrors the switched current into the current-summing node. If only one current is switched, the required number of current mirrors is one. However, if at least two switched currents are used, a multiplicity of current mirrors is advantageously required, wherein the two switched currents are preferably mirrored into the current-summing node.

Provision is made according to an embodiment of the invention that the at least one driver has a push-pull stage. The push-pull stage here has at least two complementary transistors, wherein one transistor of the complementary transistors is supplied with a programming potential. If both a positive and a negative programming potential are used for programming the nonvolatile memory array, a first transistor of the complementary transistors is connected to a first terminal of the positive programming potential and a second transistor of the complementary transistors is connected to a second terminal of the negative programming potential. In this context, the push-pull stage preferably has at least one PMOS transistor and at least one NMOS transistor, wherein both the PMOS transistor and the NMOS transistor have a drain-source breakdown voltage suitable for the programming potentials used. Advantageously, the source terminal of the PMOS transistor is connected to a first positive programming potential and the source terminal of the NMOS transistor is connected to a second negative programming potential.

According to an embodiment of the invention, a decoder is connected between the drive circuit and the at least one driver. This decoder is advantageously designed as a multiplexer. The decoder permits the decoding of the information (bit values) present at the input of the drive circuit regarding the rows and columns of the volatile memory array, and connects the relevant bit value that is present to the driver of the row or column of the volatile memory array selected by the decoding. In principle, it is also possible to switch the drive circuit between the decoder and the driver. In this alternative case, the already decoded values for the rows and columns of the volatile memory array would each be converted into a control potential in the drive circuit for programming.

According to an another embodiment of the invention, the current-to-voltage converter is connected by a first supply voltage terminal to a first programming potential and by a second supply voltage terminal to a second programming potential. The first supply voltage terminal and the second supply voltage terminal are preferably independent of supply voltage terminals for the logic potentials here. Preferably, a differential voltage between the first programming potential and the second programming potential corresponds here to a logic voltage between a first logic potential and a second logic potential. It is also sufficient for the differential voltage to be set in the manner of such a logic voltage, thus essentially corresponding to it or approaching it.

The memory device has a variable voltage source. Preferably, the first supply voltage terminal and/or the second supply voltage terminal are connected to the variable voltage source. It is advantageous for the variable voltage source to have a voltage regulator or a controllable charge pump that may be integrated with the driver and the drive circuit on a semiconductor chip, for example. The variable voltage source can output variable voltages or potentials. For the purpose of variation, the voltages or potentials of the variable voltage source can be, e.g., continuously controllable or, e.g., switched. The variable voltage source is connected to the drive circuit for adjusting the control potential for programming of the nonvolatile memory array.

Provision can also be made for the variable voltage source to be connected to a number of supply terminals of the decoder. In this context, the decoder is advantageously designed for programming voltages that occur, and to this end has appropriate transistors with sufficient voltage-carrying capacity.

A means for limiting the current drawn from the first and/or second supply voltage terminal is provided. It is advantageous for this means to be a part of the drive circuit that draws current from the voltage source. It is advantageous for the means for limiting the current draw to have at least one constant current source, which outputs the switched current.

The drive circuit can be connected both to the supply voltage terminals for the programming potentials and to the supply voltage terminals for the logic potentials. According to a preferred embodiment, the drive circuit has connections such that the switched current flows between a logic potential (Vdd or ground) and a programming potential.

In an embodiment of the invention, provision is made that a first drive circuit and a second drive circuit, which preferably is complementary to the first drive circuit, are designed to output a first positive control potential through the first drive circuit and to output a second negative control potential through the second drive circuit. In this context, the first drive circuit is connected to a PMOS transistor of the driver for driving a positive programming potential, and the second drive circuit is connected to an NMOS transistor of the driver for driving a negative programming potential.

According to an embodiment, the memory device can be designed and configured such that the memory array is operated with the positive programming potential as well as with the negative programming potential, wherein the positive programming potential is more positive than any logic potential, and the negative programming potential is more negative than any logic potential.

It is a further object of the invention to provide a method. Thus, a drive circuit is provided for driving at least one drive circuit for driving a programmable potential for programming a nonvolatile memory array. At least one switch of the drive circuit switches a current on the basis of a digital logic potential at an input. A current-to-voltage converter of the drive circuit outputs a control potential for driving at least one driver.

Instead of specifying potentials, it is also possible to define voltages that are referenced to a fixed reference potential, for example a ground potential.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 a block diagram of a memory array field according to the conventional art, FIG. 2 a cross-section through a memory cell with floating gate according to the conventional art, FIG. 3a a first embodiment of a drive circuit, FIG. 3b a second embodiment of a drive circuit, and FIG. 4 a block diagram of a memory array field with drive electronics.

DETAILED DESCRIPTION

Figure 3A:
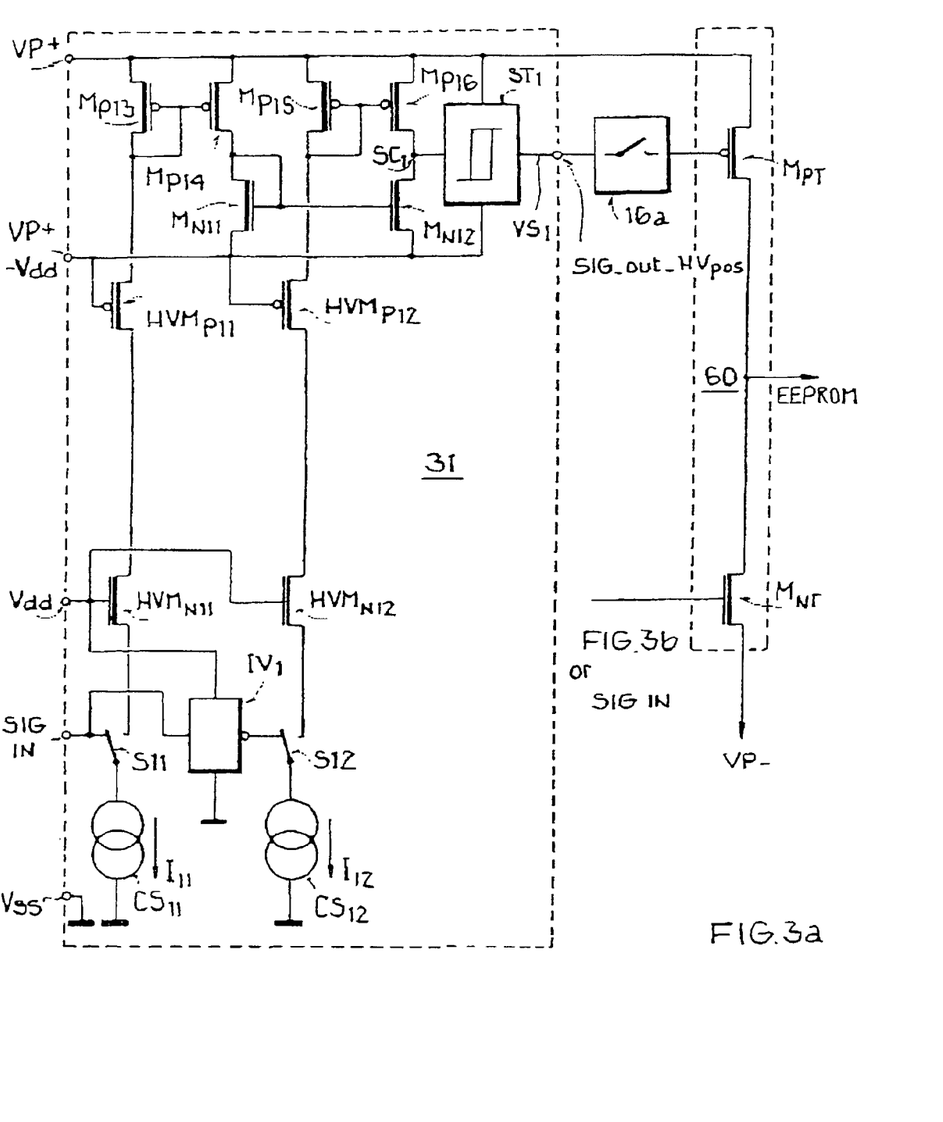

One function of a drive circuit 31, such as is shown in FIG. 3a, is to output the logic signal (logic 1=Vdd or logic zero=Vss) present at an input SIG IN to a high voltage output SIG_out_HVpos. In this regard, the input signal logic 1=Vdd at the input results in the output signal $VP^+$–Vdd, while the input signal logic zero=Vss results in the output signal $VP^+$.

The drive circuit 31 from FIG. 3a has two circuit sections, wherein the first circuit section is supplied with the logic potential Vdd (logic one) and ground (Vss; logic zero) in order to produce the logic voltage Vdd. In contrast, the second circuit section is supplied with the programming potentials $VP^+$ and $VP^+$–Vdd. In this context, the following applies:

$$VP^+ - (VP^+ - Vdd) = Vdd.$$

Accordingly, the potential difference between the programming potentials $VP^+$ and $VP^+$–Vdd at least approaches, or is even equal to, the logic voltage Vdd, so that the same technology can be used in both circuit sections of the drive circuit 31 for the logic transistors $M_{N11}$, $M_{N12}$ and $M_{P13}$ through $M_{P16}$.

The programming potentials $VP^+$ and $VP^+$–Vdd here are significantly higher than the logic potentials Vdd and ground (Vss). For example, ground is 0 volts, Vdd=3.3 volts, $VP^+$=12 volts, and $VP^+$–Vdd=8.7 volts. The breakdown voltage of the logic transistors $M_{N11}$, $M_{N12}$ and $M_{P13}$ through $M_{P16}$ is designed here for the logic voltage Vdd of 3.3 volts. The programming potentials $VP^+$ and $VP^+$–Vdd are both required to drive a PMOS transistor $M_{PT}$ as a positive branch of a push-pull stage 60. The source terminal of the PMOS transistor $M_{PT}$ is likewise connected to the programming potential $VP^+$ and passes it through to memory cells of a nonvolatile memory array EEPROM for programming.

To this end, the drive circuit has the high voltage output SIG_out_HVpos for controlling the driver transistor $M_{PT}$ of the push-pull stage 60 for programming the nonvolatile memory array EEPROM of an electrically erasable programmable read only memory or of an electrically programmable read only memory. A decoder 16a can preferably be connected between the drive circuit 31 and the push-pull stage 60, as is explained in detail with reference to FIG. 4. Alternatively, this decoder 16a can also be connected ahead of the drive circuit 31. In this case, however, a drive circuit would have to be provided for each output of the decoder 16a so that more chip area might be required.

The drive circuit 31 accordingly has four supply terminals for the potentials ground (Vss), Vdd, $VP^+$ and $VP^+$–Vdd, and has a signal input SIG IN in addition to the high voltage signal output SIG_out_HVpos, which is connected to the PMOS transistor $M_{PT}$ of the push-pull stage 60 by the decoder 16a.

The drive circuit 31 has two switches $S_{11}$ and $S_{12}$, wherein the switch $S_{11}$ is directly connected to the signal input SIG IN of the drive circuit 31. In contrast, the switch $S_{12}$ is connected to the signal input SIG IN through an inverter $IV_1$. Consequently the switches switch in a logically disjoint manner. PMOS or NMOS transistors may be used as switches, for example. In addition, the drive circuit 31 has two current sources $CS_{11}$ and $CS_{12}$, which are connected to the switches $S_{11}$ and $S_{12}$ in such a manner that the current $I_{11}$ or $I_{12}$ of the applicable current source $CS_{11}$ or $CS_{12}$ is switched by the respective switch $S_{11}$ or $S_{12}$ as a function of a digital logic potential at the input SIG IN. The digital logic potential here is a binary value, which is to say either logic one, which corresponds to the potential Vdd, or logic zero, which corresponds to the potential ground (Vss). The current sources $CS_{11}$ and $CS_{12}$ produce the advantageous result that the current $I_{11}$ or $I_{12}$ from supply terminals is limited for the programming potentials $VP^+$ and $VP^+$–Vdd.

Moreover, the drive circuit 31 has a current-to-voltage converter connected to an output SIG_out_HVpos, which in the exemplary embodiment of FIG. 3a includes the current mirrors $M_{11}$, $M_{N12}$, the current mirror $M_{P13}$, $M_{P14}$, the current mirror $M_{P15}$, $M_{P16}$, and the Schmitt trigger $ST_1$. The current-to-voltage converter is designed to output a control potential $VS_1$ dependent upon the control potential $VS_1$ for controlling the driver 60. To this end, the current mirrors $M_{P13}$, $M_{P14}$ and $M_{N11}$, $M_{N12}$ mirror the switched current $I_{11}$ from the current source $CS_{11}$ as a negative value to a current-summing node $SC_1$. The current mirror $M_{P15}$, $M_{P16}$ mirrors the switched current $I_{12}$ from the current source $CS_{12}$ as a positive value to the current-summing node $SC_1$.

Since the currents $I_{11}$ and $I_{12}$ are never simultaneously switched on by the inverter $IV_1$, the charge is displaced in the current-summing node $SC_1$, with the result that only one capacitance in the current-summing node $SC_1$ is charged, and no significant transverse current flows through the current-summing node. Thus, the upper programming potential $VP^+$ or the lower programming potential $VP^+$–Vdd is present at the input of the Schmitt trigger connected to the current-summing node $SC_1$ as a function of the digital potential at the input SIG IN of the drive circuit 31. Independently of the steepness of the edges of the signals, the Schmitt trigger $ST_1$ ensures that a digital signal is output at the output SIG_out_HVpos.

The transistors $M_{N11}$, $M_{N12}$, $M_{P13}$, $M_{P14}$, $M_{P15}$, $M_{P16}$ of the current mirrors, the Schmitt trigger $ST_1$, the switches $S_{11}$ and $S_{12}$, and also the current sources $CS_{11}$ and $CS_{12}$ are designed with regard to their breakdown voltage only for logic potential differences that are smaller than a potential difference to the programming potential $VP^+$. In order to protect these circuit components from destruction, the high voltage NMOS field effect transistors $HVM_{N11}$ and $HVM_{N12}$ are provided, each of whose gate terminals is connected to the logic potential Vdd, so that only a potential that is smaller than the logic potential Vdd by the threshold voltage can be present at their source connection in each case.

These high voltage NMOS field effect transistors $HVM_{N11}$ and $HVM_{N12}$ are additionally designed such that the voltage difference between the programming potential $VP^+$ and a logic potential (Vdd or ground) can drop across their drain-source path without their drain-source path breaking down. The same function was performed by the high voltage PMOS field effect transistors $HVM_{P11}$ and $HVM_{P12}$, which in contrast to the example embodiment in FIG. 3a can also be omitted insofar as the voltage drop across the high voltage NMOS field effect transistors $HVM_{N11}$ and $HVM_{N12}$ is sufficient. Since only a voltage that is smaller than or equal to the logic voltage drops across the gate oxide of the high voltage NMOS field effect transistors $HVM_{N11}$ and $HVM_{N12}$ or the high voltage PMOS field effect transistors $HVM_{P11}$ and HVM$_{P12}$, it is not necessary to design the high voltage transistors with thicker gate oxide.

If an output potential VS$_1$ at the output SIG_out_HVpos corresponds to VP$^+$ here, this potential value is present at a gate of the driver transistor M$_{PT}$ of the push-pull stage 60. Since this driver transistor's source terminal is also connected to this potential value VP$^+$, this transistor M$_{PT}$ is switched off. If, in contrast, the output potential VS$_1$ corresponds to VP$^+$−Vdd, the voltage at the gate terminal of the transistor M$_{PT}$ is lower by the amount Vdd, so that the transistor M$_{PT}$ conducts and switches the potential VP$^+$ to a cell of the nonvolatile memory array EEPROM.

While not shown in FIG. 3a, further provision is preferably made that a variable voltage source is connected to a first supply voltage terminal of the drive circuit 31 in order to apply the first variable programming potential VP$^+$ and is connected to a second supply voltage terminal of the drive circuit 31 in order to apply a second variable programming potential VP$^+$−Vdd. In advantageous fashion, the variable voltage source is designed such that the second variable programming potential VP$^+$−Vdd is different from the first variable programming potential VP$^+$ by a fixed differential voltage Vdd. This has the advantageous effect that the supply voltage Vdd of the drive circuit 31 remains essentially constant over time as a fixed difference between the two programming potentials VP$^+$ and VP$^+$−Vdd, independent of an absolute change in the two programming potentials VP$^+$ and VP$^+$−Vdd. In advantageous fashion, the differential voltage Vdd has the character of a logic voltage provided on the semiconductor chip, so that the transistors M$_{N11}$, M$_{N12}$, M$_{P13}$, M$_{P14}$, M$_{P15}$, M$_{P16}$ of the current mirror of the drive circuit 31 can be of the same technology corresponding to the logic.

Figure 3B:
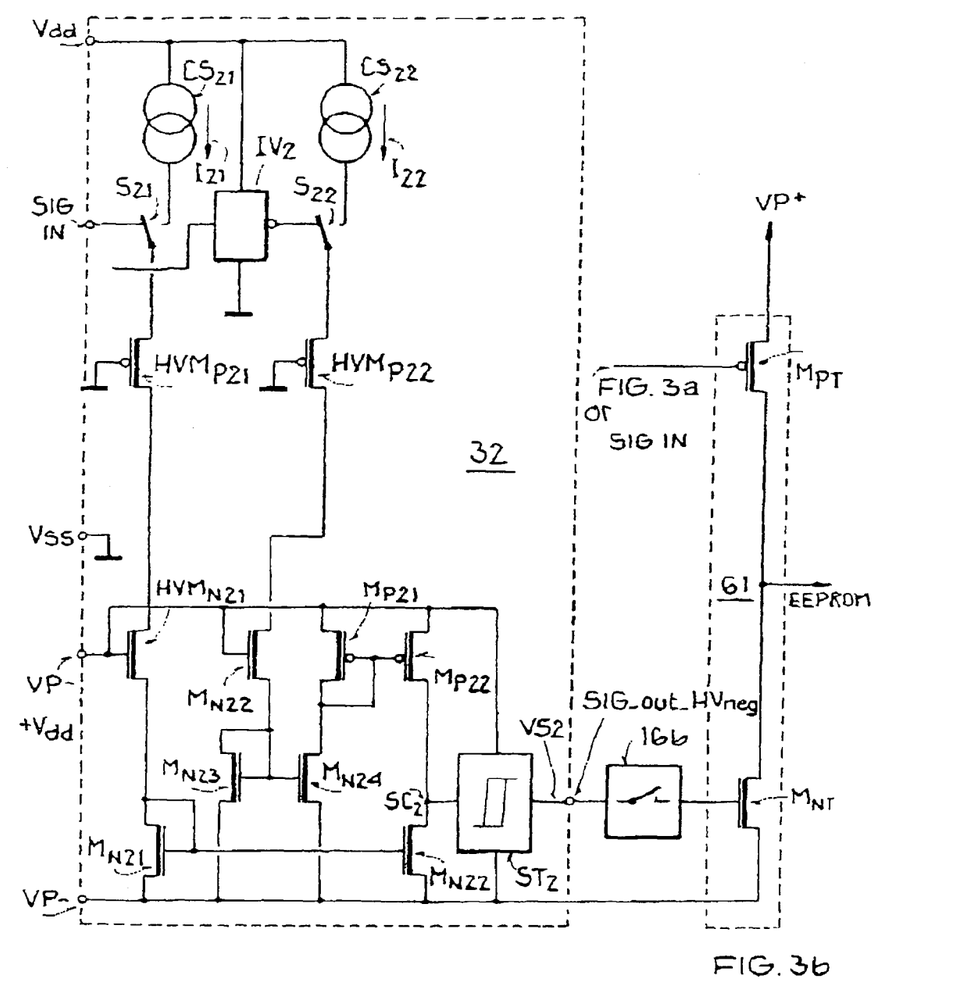

In FIG. 3a, the high-side transistor M$_{PT}$ of the push-pull stage 60 is driven by the drive circuit 31 by means of the control potential VS$_1$, which can take on the potentials VP$^+$ or VP$^+$−Vdd. If the second (negative) programming potential is the ground potential, a low side transistor M$_{NT}$ of the push-pull stage 60 can be driven directly by the logic potentials Vdd and ground (Vss) (indicated in FIG. 3a by SIG IN). If the second programming potential is not ground or Vss, but instead a second more negative programming potential VP$^-$ is necessary for programming, the drive circuit is augmented by a negative complementary branch 32. This negative complementary branch 32 is shown in FIG. 3b as a block diagram. It, too, has current mirrors M$_{N21}$, M$_{N22}$, M$_{N23}$, M$_{N24}$, M$_{P21}$, M$_{P22}$, a Schmitt trigger ST$_2$, switches S$_{21}$ and S$_{22}$, current sources CS$_{21}$ and CS$_{22}$, an inverter IV$_2$, and high voltage NMOS field effect transistors HVM$_{N21}$, HVM$_{N22}$ and high voltage PMOS field effect transistors HVM$_{P21}$ and HVM$_{P22}$.

The principle of operation of the drive circuit 32 in FIG. 3b is analogous to that of the drive circuit 31 in FIG. 3a, with the difference that a negative control potential is output at the high-voltage output SIG_out_HVneg, and is directed through a decoder 16b to a high voltage NMOS field effect transistor M$_{NT}$ of the driver 60 and opens or switches off this high voltage NMOS field effect transistor M$_{NT}$, so that the associated terminals of the nonvolatile memory cells of the array EEPROM can be connected to the negative programming potential VP$^-$.

Figure 4:
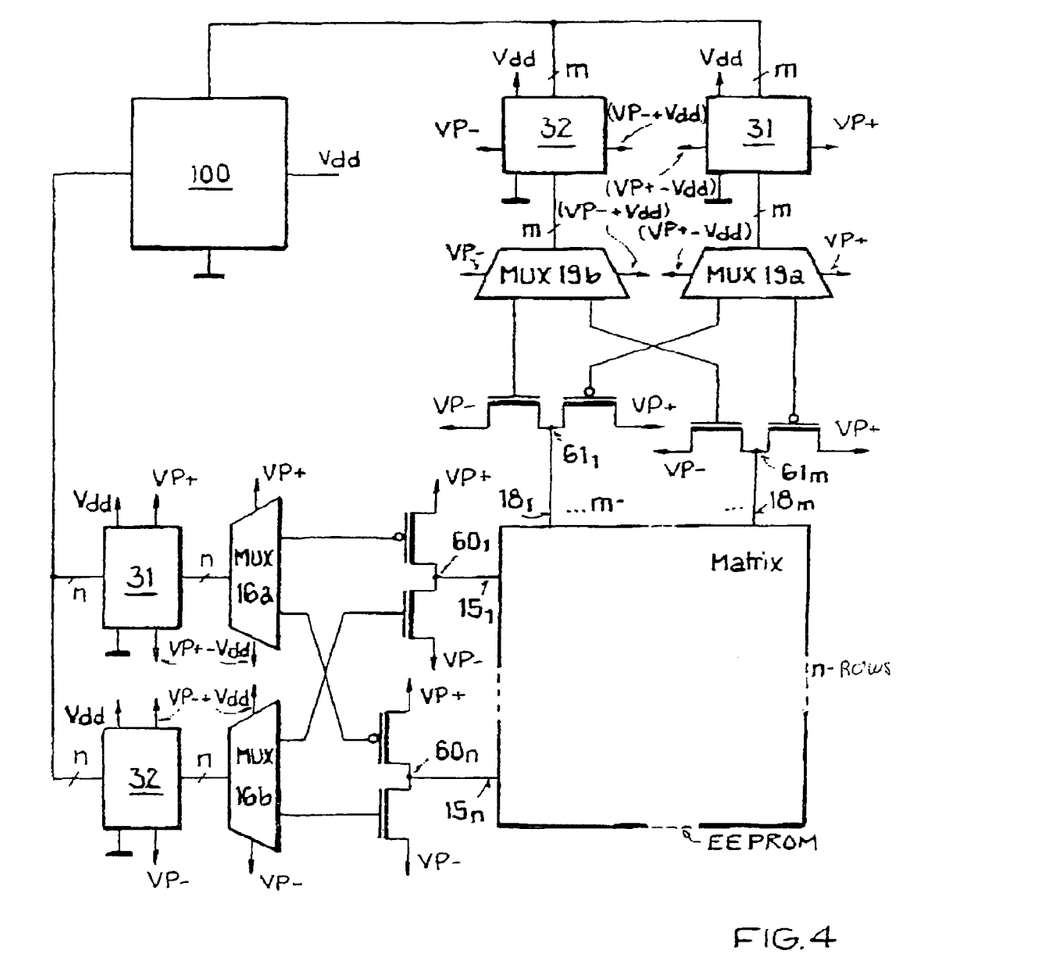

FIG. 4 shows a block diagram of a memory device. The logic 100, for example a controller, is connected through an n-bit wide parallel bus to a number n of drive circuits 31 and a number n of drive circuits 32. All outputs of the drive circuits 31 and 32 are connected, each through an n-bit wide parallel bus, to decoders 16a and 16b, which drive the n lines of the array EEPROM through push-pull stages 60$_1$ through 60$_n$. A corresponding structure is provided for the m columns through the decoders 19a and 19b. It is especially advantageous here that the decoders 16a, 16b and 19a, 19b are connected after the signal memories 31, 32 and before the push-pull stages 60$_1$ through 60$_n$ and 61$_1$ through 61$_m$. Chip area can be saved by this means.

The decoders (MUX) 16a and 19a are connected to supply voltage terminals with the programming potentials VP$^+$ and VP$^+$−Vdd in order to drive the high side transistors of the push-pull stages 60$_1$ through 60$_n$ and 61$_1$ through 61$_m$. The decoders (MUX) 16b and 19b are connected to supply voltage terminals with the programming potentials VP$^-$ and VP$^-$+Vdd in order to drive the low side transistors of the push-pull stages 60$_1$ through 60$_n$ and 61$_1$ through 61$_m$. The drive circuits 31 and 32 are also connected to the same supply voltage terminals.

The design of the drive circuits 31, 32 in accordance with the example embodiments in FIGS. 3a and 3b has the advantage that only one type of NMOS transistor and one type of PMOS transistor are required, since no programming voltage that depends on the programming potentials V$^+$ or V$^-$ drops across their gate voltage. There is no need for transistors with the additional gate oxide thickness required for this purpose.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A memory device comprising:
   a nonvolatile memory array;
   at least one driver for programming the memory array, which driver is connected to the memory array in order to drive a programming potential; and
   a drive circuit for controlling the at least one driver, the drive circuit having at least one current source for providing a current,
   wherein the drive circuit has at least one switch for switching the current as a function of a digital logic potential at an input, and
   wherein the drive circuit has a current-to-voltage converter connected to an output, wherein said current-to-voltage converter outputs a control potential depending on the switched current for driving the at least one driver.

2. The memory device according to claim 1, wherein the current-to-voltage converter has a current-summing node, and wherein the control potential depends on the potential at the current-summing node.

3. The memory device according to claim 2, wherein the current-to-voltage converter has a threshold switch that is connected to the current-summing node and to the output of the drive circuit.

4. The memory device according to claim 2, wherein the current-to-voltage converter has a plurality of current mirrors for mirroring the switched current into the current-summing node.

5. The memory device according to claim 1, wherein the at least one driver has a push-pull stage.

6. The memory device according claim 1, wherein a decoder is connected between the drive circuit and the at least one driver.

7. The memory device according to claim 1, wherein the current-to-voltage converter is connected by a first supply voltage terminal to a first programming potential and by a second supply voltage terminal to a second programming potential.

8. The memory device according to claim 7, wherein a differential voltage between the first programming potential and the second programming potential corresponds to a logic voltage between a first logic potential and a second logic potential or is set in a manner of such a logic voltage.

9. The memory device according to claim 7, wherein the first supply voltage terminal and/or the second supply voltage terminal are connected to a variable voltage source.

10. The memory device according to claim 9, wherein the variable voltage source has a voltage regulator or a controllable charge pump.

11. The memory device according to claim 7, having a limiter for limiting the current drawn from the first and/or second supply voltage terminal.

12. The memory device according to claim 11, wherein the limiter for limiting the current draw has at least one constant current source, which outputs the switched current.

13. The memory device according to claim 1, wherein the drive circuit has connections such that the switched current flows between a logic potential and a programming potential.

14. A memory device comprising:
a nonvolatile memory array;
at least one driver for programming the memory array, which driver is connected to the memory array in order to drive a programming potential; and
a drive circuit for controlling the at least one driver,
wherein the drive circuit has at least one switch for switching a current as a function of a digital logic potential at an input, and
wherein the drive circuit has a current-to-voltage converter connected to an output, wherein said current-to-voltage converter outputs a control potential depending on the switched current for driving the at least one driver, wherein said least drive circuit includes a first drive circuit section, and a second drive circuit section that is complementary to the first drive circuit section, and wherein said first drive circuit section outputs a first positive control potential and said second drive circuit section outputs a second negative control potential, and wherein the first drive circuit section is connected to a PMOS transistor of the driver for driving a positive programming potential, and the second drive circuit section is connected to an NMOS transistor of the driver or driving a negative programming potential.

* * * * *